United States Patent
Lee et al.

(10) Patent No.: US 9,054,234 B2
(45) Date of Patent: Jun. 9, 2015

(54) METHOD OF MANUFACTURING NITRIDE SEMICONDUCTOR DEVICE

(71) Applicants: Samsung Electronics Co., Ltd., Suwon-Si, Gyeonggi-do (KR); Research & Business Foundation Sungkyunkwan University, Suwon-Si, Gyeonggi-do (KR)

(72) Inventors: Moon-Sang Lee, Seoul (KR); Sung-Soo Park, Seongnam-si (KR); Bong-Kyun Kang, Ansan-si (KR); Dae-Ho Yoon, Suwon-si (KR)

(73) Assignees: SAMSUNG ELECTRONICS CO., LTD., Suwon-Si, Gyeonggi-Do (KR); RESEARCH & BUSINESS FOUNDATION SUNGKYUNKWAN UNIVERSITY, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/522,152

(22) Filed: Oct. 23, 2014

(65) Prior Publication Data
US 2015/0125982 A1    May 7, 2015

(30) Foreign Application Priority Data
Nov. 5, 2013    (KR) .................. 10-2013-0133821

(51) Int. Cl.
    *H01L 21/20*    (2006.01)
    *H01L 33/00*    (2010.01)

(52) U.S. Cl.
    CPC ........ *H01L 33/0075* (2013.01); *H01L 33/0066* (2013.01)

(58) Field of Classification Search
    CPC ..... H01L 29/2003; H01L 33/32; H01L 29/78; H01L 33/62; H01L 21/0254; H01L 23/3171; H01L 27/0886; H01L 27/1225; H01L 29/66969; H01L 29/7787; H01L 33/0075; H01L 33/06; H01L 33/60
    USPC .................... 257/2–4, 615, E29.089, E21.09; 438/382, 478
    See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| CN | 1855559 A | 11/2006 |
| KR | 10-0921789 B1 | 10/2009 |

(Continued)

OTHER PUBLICATIONS

Hung, S.C., et al.: "Self-formation of GaN hollow nanocolumns by inductively coupled plasmas etching", Proceedings of 2005 5th IEEE Conference on Nanotechnology, Nagoya, Japan, Jul. 2005, 5 pages.

*Primary Examiner* — Mark A Laurenzi
(74) *Attorney, Agent, or Firm* — McDermott Will & Emery LLP

(57) ABSTRACT

A nitride semiconductor device may include a substrate, a dislocation control layer formed on the substrate and including a plurality of hollow structures including a nitride, and a nitride semiconductor layer formed on the dislocation control layer.

16 Claims, 7 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,816,241 B2 | 10/2010 | Lee et al. |
| 7,825,418 B2 | 11/2010 | Chen |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,158,496 B2 | 4/2012 | Lee et al. |
| 8,179,938 B2 | 5/2012 | Kim |
| 8,253,147 B2 | 8/2012 | Tsang |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2006/0154451 A1 | 7/2006 | Park |
| 2006/0278880 A1 | 12/2006 | Lee et al. |
| 2010/0097975 A1 | 4/2010 | Alex et al. |
| 2010/0235115 A1 | 9/2010 | Shepard |
| 2011/0156214 A1 | 6/2011 | Yoon et al. |
| 2012/0235161 A1 | 9/2012 | Paskova et al. |
| 2012/0280208 A1 | 11/2012 | Jain |
| 2012/0280243 A1 | 11/2012 | Lee et al. |
| 2012/0286289 A1 | 11/2012 | Dipalo et al. |
| 2012/0291862 A1 | 11/2012 | Jiawook |
| 2012/0315742 A1 | 12/2012 | Yui et al. |
| 2012/0319131 A1 | 12/2012 | Park et al. |
| 2013/0001094 A1 | 1/2013 | Cable et al. |
| 2013/0009167 A1 | 1/2013 | Tan et al. |
| 2013/0021669 A1 | 1/2013 | Xi et al. |
| 2013/0036928 A1 | 2/2013 | Rogers et al. |
| 2013/0048945 A1 | 2/2013 | Fang et al. |
| 2013/0095591 A1 | 4/2013 | Yu et al. |
| 2013/0095641 A1 | 4/2013 | Lim et al. |
| 2013/0105438 A1 | 5/2013 | Zhu et al. |
| 2013/0105809 A1 | 5/2013 | Chang |
| 2013/0112379 A1 | 5/2013 | Ko et al. |
| 2013/0114133 A1 | 5/2013 | Sarto et al. |
| 2013/0126867 A1 | 5/2013 | Wang et al. |

FOREIGN PATENT DOCUMENTS

| | | |
|---|---|---|
| KR | 10-2011-0118956 A | 11/2011 |
| KR | 10-1107780 B1 | 1/2012 |
| KR | 10-2012-0043442 A | 5/2012 |
| KR | 10-2013-0007313 A | 1/2013 |

METHOD OF MANUFACTURING NITRIDE SEMICONDUCTOR DEVICE

CROSS-REFERENCE TO RELATED APPLICATIONS

This application claims the benefit of Korean Patent Application No. 10-2013-0133821, filed on Nov. 5, 2013, in the Korean Intellectual Property Office, the disclosure of which is incorporated herein in its entirety by reference.

BACKGROUND

The inventive concept relates to a method of manufacturing a nitride semiconductor device, and more particularly, to a method of manufacturing a high quality nitride semiconductor device.

An electronics industry using nitride semiconductors is anticipated with development and growth of a green industry. In particular, gallium nitride (GaN), one of the nitride semiconductors is widely used as a light emitting diode (LED) display element and a backlight. In addition, an LED consumes a smaller amount of power and has a longer life than previous light bulbs or fluorescent lamps so that the LED replaces the light bulb and the fluorescent lamp to be used as a common illumination. GaN is commonly used for manufacturing a blue LED among red, green, and blue LEDs that are core elements of high output electronic part elements including LEDs because a blue LED using GaN has a longer life and higher brightness and internal quantum efficiency than a blue LED using zinc serenade (ZnSe) that is a semiconductor material of a light emitting element that emits blue light. In addition, since GaN has a direct transition type band gap structure and the band gap of GaN may be controlled to 1.9 to 6.2 eV through an alloy of indium (In) or aluminum (Al), semiconductor layers that emit green, blue, and white light components may be manufactured. That is, since emission wavelength may be controlled by controlling band gap, characteristics of a material may be controlled in accordance with a specific apparatus characteristic.

For example, since a white LED useful to optical recording and capable of replacing the blue LED and the light bulb may be manufactured by using GaN, GaN is useful as a light element. In addition, since GaN has a high surrender voltage and is stable at high temperatures, GaN is useful to various fields such as a high output element and a high temperature electronic element that may not be implemented by conventional materials. For example, GaN may be applied to a large electronic display, a traffic light, a light source of an optical recording medium, and a high output transistor of a vehicle engine.

SUMMARY

The inventive concept provides a method of manufacturing a nitride semiconductor device capable of controlling generation of dislocations caused by a difference in lattice constant and thermal expansion coefficient between a hetero-substrate and the nitride semiconductor layer when the nitride semiconductor layer is grown on the hetero-substrate that is formed of a material different from that used to form a nitride semiconductor layer.

According to an aspect of the inventive concept, there is provided a method of manufacturing a nitride semiconductor device, including applying a solution including a plurality of core-shell structures on a substrate, evaporating a solvent from the solution including the plurality of core-shell structures to disperse the plurality of core-shell structures on the substrate, removing core parts from the dispersed plurality of core-shell structures and nitrifying shell parts to form a plurality of hollow structures including a nitride, and forming a nitride semiconductor layer on the plurality of hollow structures.

The substrate may be processed so that at least a part of a surface of the substrate may is hydrophilic.

The core parts of the core-shell structures may be carbon nanospheres formed by a hydrothermal method.

The core-shell structures may be calcined to remove the core parts from the core-shell structures.

The calcination of the core-shell structures may be performed at a temperature between about 200° C. and about 700° C.

The calcination of the core-shell structures and the nitrification of the shell parts may be separately performed. The calcination of the core-shell structures and the nitrification of the shell parts may be simultaneously performed.

The shell parts of the core-shell structures may include at least one of $Ga(OH)_3$ and $Ga(OH)CO_3$.

A diameter of the core part of the core-shell structure may be about 80 nm to about 10 um.

The method may further include forming a buffer layer on the substrate after forming of the plurality of hollow structures.

The method may further include forming a buffer layer on the substrate before forming the plurality of hollow structures.

The buffer layer may include at least one of zinc oxide (ZnO), boron nitride (BN), aluminium nitride (AlN), gallium nitride (GaN), and $Al_{1-x}Ga_xN$ (0<x<1).

The substrate may be at least one of a sapphire substrate, a silicon substrate, and a silicon carbide (SiC) substrate.

In forming of the nitride semiconductor layer, an n-type gallium nitride layer, an activation layer, and a p-type gallium nitride layer may be sequentially stacked on the substrate.

In the method of manufacturing the nitride semiconductor device according to an embodiment of the inventive concept, the plurality of hollow structures including the nitride are simply formed so that a high quality nitride thin film, for example, a GaN thin film may be grown on the hetero-substrate from the nitride semiconductor layer and may be applied to manufacturing of horizontal and vertical nitride semiconductor light emitting elements.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
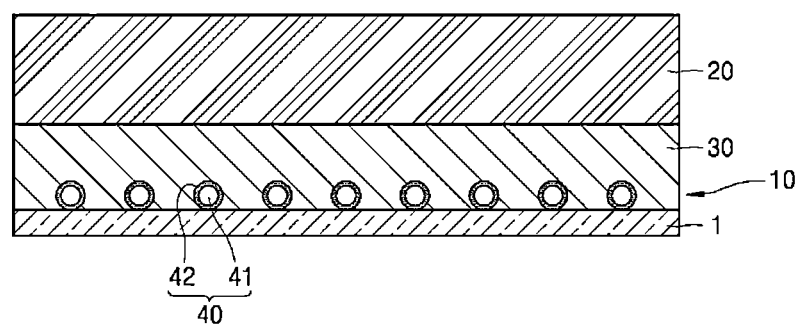
FIG. 1 is a cross-sectional view schematically illustrating a nitride semiconductor device according to an embodiment of the inventive concept.

A nitride semiconductor device according to an embodiment of the inventive concept and a method of manufacturing the same now will be described more fully hereinafter with reference to the accompanying drawings, in which elements of the inventive concept are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

As well known, a nitride semiconductor layer based on a nitride is commonly implemented in the form of a thin film with a two-dimensional structure. However, when the nitride semiconductor layer in the form of the thin film is epitaxially grown on a hetero-substrate that is formed of a different material from that used to form a nitride semiconductor layer, due to a difference in lattice constant and thermal expansion coefficient between the substrate and the nitride semiconductor layer, large defects may be generated.

In order to reduce dislocation concentration of the nitride semiconductor layer, a lateral epitaxial overgrowth (LEO) method and a pendeo method are currently most widely used.

The LEO method uses a principle in which GaN is not grown on $SiO_2$ or $Si_3N_4$. The LEO method includes forming patterns having a predetermined shape is formed of $SiO_2$ or $Si_3N_4$ on a sapphire substrate, and then growing a GaN epitaxial layer only in a part where sapphire is exposed.

The pendeo method includes growing a GaN epitaxial layer, forming a groove by etching a portion of a pattern after forming the pattern on the GaN epitaxial layer and re-growing a GaN epitaxial layer on a resultant structure. Both of the two methods are methods of controlling or repressing that defects formed at an interface between the sapphire substrate and the GaN epitaxial layer move to a surface of the GaN epitaxial layer by changing the direction of dislocation, which is generated during a process of growing the GaN epitaxial layer and is propagated to the surface, to the lateral side of the GaN epitaxial layer.

However, the above methods have complicated processes, such as, forming a mask layer on a substrate, patterning the mask layer and like. In addition, in order to form roughness or curving, dry etching is mainly performed so that defects such as vacancy, impurities, dry etching residuals, and physical damage are produced on a semiconductor substrate after performing dry etching, and element efficiency may be thereby reduced. Furthermore, a nonstoichiometric surface is formed by dry etching so that reliability of the element may be deteriorated and a life of the element may be reduced.

In the nitride semiconductor device according to the embodiment of the inventive concept, a plurality of hollow structures including a nitride are formed on a hetero-substrate from a nitride semiconductor layer so that it is possible to control generation of dislocation caused by a difference in lattice constant and thermal expansion coefficient between the hetero-substrate and the nitride semiconductor layer without performing the complicated processes of forming the mask layer on the substrate and patterning the mask layer.

Figure 2:
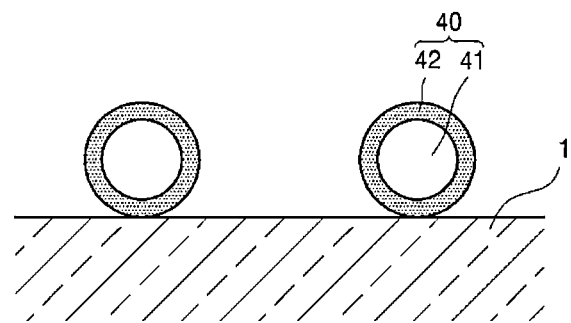
FIG. 2 is a cross-sectional view illustrating the enlarged hollow structures of FIG. 1.

FIG. 1 is a cross-sectional view schematically illustrating a nitride semiconductor device according to an embodiment of the inventive concept. FIG. 2 is a cross-sectional view illustrating the enlarged hollow structures 40 of FIG. 1.

Referring to FIGS. 1 and 2, a nitride semiconductor according to an embodiment of the inventive concept includes a substrate 1, a dislocation control layer 10 formed on the substrate 1, and a nitride semiconductor layer 20 formed on the dislocation control layer 10.

The substrate 1 may be a hetero-substrate that is formed of a different material than that used to form a nitride semiconductor layer 20 to be epitaxially grown. For example, the substrate 1 may be one of a sapphire substrate, a silicon substrate, and a silicon carbide (SiC) substrate. The substrate 1 may be a conductive substrate.

The dislocation control layer 10 controls generation of dislocation caused by a difference in lattice constant and thermal expansion between the substrate 1 and the nitride semiconductor layer 20. For example, the dislocation control layer 10 may prevent or suppress generation of dislocation.

The dislocation control layer 10 may include a plurality of hollow structures 40. The hollow structure 40 may include a hollow 41 of a predetermined size and an external wall 42 of a predetermined thickness, which surrounds the hollow 41.

Since the hollow structure 40 includes the hollow 41, a material that fills the hollow 41, for example, air may prevent defects from propagating. Therefore, defect density may be reduced. For example, the defect density of the nitride semiconductor layer 20 may be reduced to less than about $10^8/cm^2$.

Since the hollow structure 40 includes the hollow 41, the hollow structure 40 may be easily compressed when external force is applied. Therefore, tension generated by a difference in thermal expansion coefficient between the substrate 1 and the nitride semiconductor layer 20, for example, tension applied to the nitride semiconductor layer 20 may be reduced.

Since a refractive index of the hollow 41 is different from that of the external wall 42 in the hollow structure 40, a scattered reflection effect is induced so that external quantum efficiency of the nitride semiconductor device may be increased.

The hollow structure 40 includes a nitride. It is possible to prevent the hollow structure 40 including a nitride from being ashed by an external environment. For example, during a metal organic chemical vapor deposition (MOCVD) process of forming the nitride semiconductor layer 20 or a buffer layer 30 to be described later, the hollow structure 40 may not be ashed although the hollow structure 40 is exposed to a carrier gas, for example, a hydrogen $H_2$ gas.

When the hollow structure 40 does not include the nitride, for example, when the hollow structure 40 includes an oxide, the hollow structure 40 may be vulnerable to the external environment. For example, when the hollow structure 40 including silicon oxide ($SiO_2$) is exposed to $H_2$ gas, the hollow structure 40 is ashed by a chemical reaction to the $H_2$ gas. Therefore, effect of the hollow structure 40, for example, reduction in the defect density and tension and increase in external quantum efficiency may not be obtained.

However, according to the inventive concept, since the hollow structure 40 includes the nitride so that the function of the hollow structure 40 may be performed regardless of the external environment, reduction in defect density and tension and increase in the external quantum efficiency of the nitride semiconductor layer 20 may be stably induced. The hollow structure 40 may include at least one of GaN, zinc nitride (ZnN), silicon nitride (SiN), and aluminium nitride (AlN).

An internal diameter of the hollow structure 40 may be about 80 nm to about 10 um. However, the internal diameter of the hollow structure 40 is not limited to the above and may vary with a thickness of the external wall of the hollow structure 40. Density (or surface density) of the hollow structure 40 may be $10^4$ to $10^{10}$/cm$^2$.

The dislocation control layer 10 may further include the buffer layer 30. The buffer layer 30 may reduce a difference in lattice constant between the substrate 1 and the nitride semiconductor layer 20 to reduce the defect density of the nitride semiconductor layer 20. The buffer layer 30 may include at least one of zinc oxide (ZnO), boron nitride (BN), aluminium nitride (AlN), GaN, and $Al_{1-x}Ga_xN$. Here, x satisfies 0<x<1.

The nitride semiconductor layer 20 may be formed on the dislocation control layer 10. The nitride semiconductor layer 20 may be epitaxially grown. The nitride semiconductor layer 20 based on a nitride may include GaN. For example, the nitride semiconductor layer 20 may be $In_xAl_yGa_{1-x-y}N$ (0≤x, 0≤y, x+y≤1). The nitride semiconductor layer 20 may have a single layer structure or a multilayer structure.

Hereinafter, a method of manufacturing the above-described nitride semiconductor device will be described.

Figure 3:
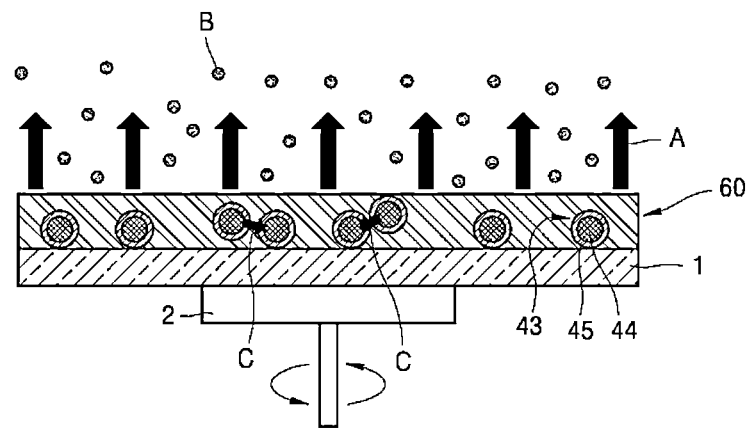
FIG. 3 is a view schematically illustrating a spin coating process of dispersing hollow structures on a substrate.
Figure 4A:
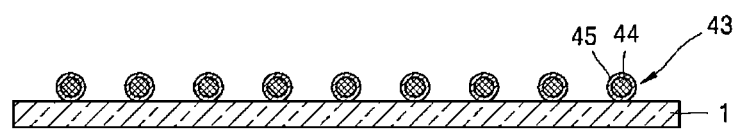
FIGS. 4A to 4C are views schematically illustrating a process of forming hollow structures on a substrate.
Figure 4B:
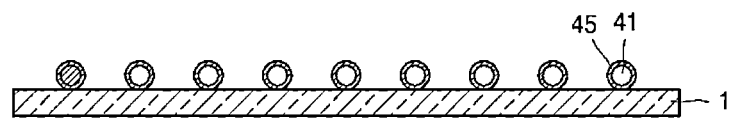
Figure 4C:
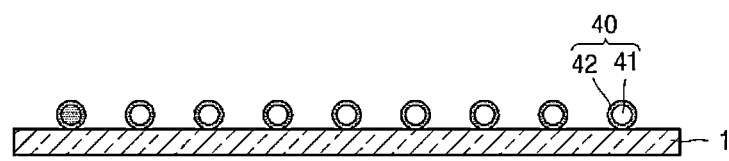
Figure 5A:
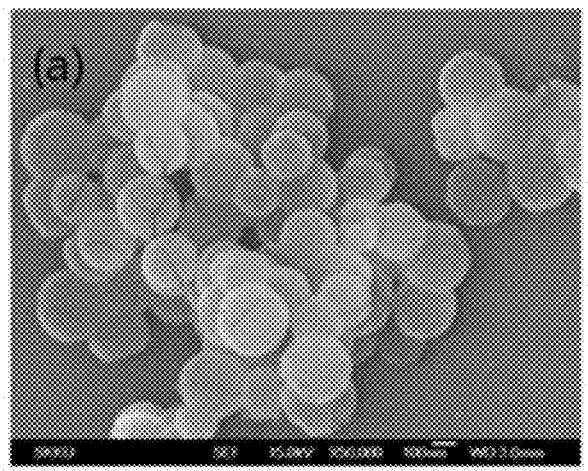
FIGS. 5A to 5C are scanning electron microscope (SEM) photographs illustrating the process of forming the hollow structures of FIGS. 4A to 4C.
Figure 5B:
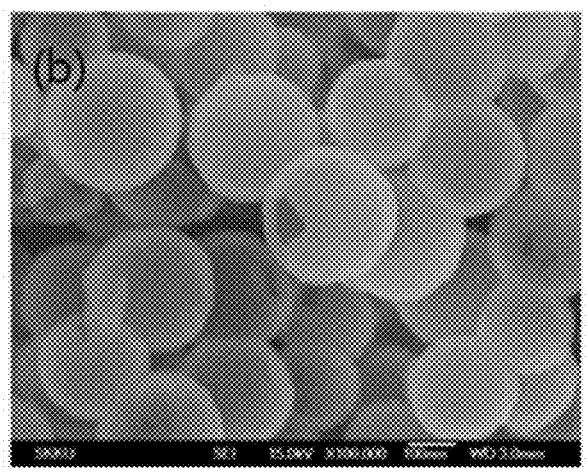
Figure 5C:
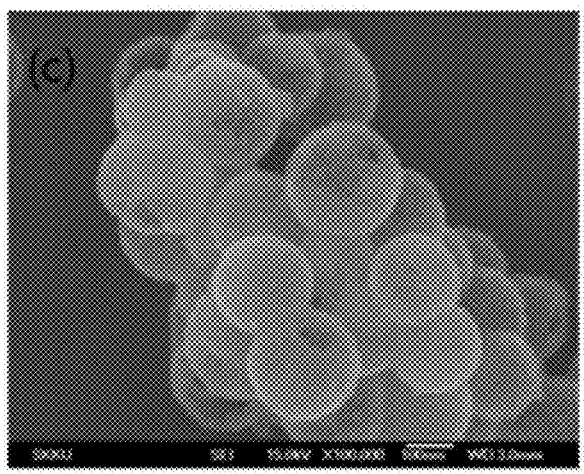

FIG. 3 is a view schematically illustrating a spin coating process of dispersing the hollow structures 40 on the substrate 1. FIGS. 4A to 4C are views schematically illustrating a process of forming the hollow structures 40 on the substrate 1. FIGS. 5A to 5C are scanning electron microscope (SEM) photographs illustrating the process of forming the hollow structures 40 of FIGS. 4A to 4C.

Referring to FIG. 3, substrate 1 is provided to be mounted on a rotatable support 2. Then, a solution 60 including core-shell structures 43 is applied(or coated) on the substrate 1.

The substrate 1 may be a hetero-substrate that is formed of a different material than that used to form a nitride semiconductor layer 20 to be epitaxially grown. The substrate 1 may be a hydrophilic substrate. In order to make the substrate 1 hydrophilic, at least a part of a surface of the substrate 1 may be processed by using a solution including at least one of $H_2SO_4$, $H_2O_2$, and deionized water for a predetermined time, for example, about 30 minutes. Therefore, the core-shell structures 43 on the substrate 1 may be uniformly distributed.

The support 2 on which the substrate 1 is mounted is rotated so that the solution 60 including the core-shell structures 43 may be spin coated on the substrate 1.

Core parts 44 may be carbon nanospheres formed by using a hydrothermal method. For example, the core parts 44 may be synthesized in a high temperature and pressure chamber (not shown), for example, in an autoclave by using glucose as a raw material.

Shell parts 45 surround the core parts 44. The shell parts 45 that surround the core parts 44 may be synthesized by injecting a predetermined material that does not react to the core parts 44 into the chamber in which the core parts 44 are arranged. For example, the shell parts 45 that surround the core parts 44 may be synthesized by injecting gallium ($Ga^{3+}$) and water ($H_2O$) into the chamber. In the method of forming the shell parts 45 as described above, since reaction to the core parts 44, for example, hydrolysis and condensation polymerization, is not used, the shell parts 45 may be formed by a simple process and a material of the shell parts 45 may be freely selected.

The shell parts 45 may include $Ga(OH)CO_3$ or $Ga(OH)_3$. When the shell parts 45 are formed, urea $(NH_2)_2CO$ may be selectively added.

As an example, when the urea is added, reaction of the following (1) is performed so that the shell parts 45 including $Ga(OH)CO_3$ may be formed around the core parts 44.

$$Ga^{3+}+(NH_2)_2CO+3H_2O\rightarrow Ga(OH)CO_3+2NH_4^++H^+ \quad (1)$$

As another example, when the urea is not added, reaction of the following (2) is performed so that the shell parts 45 including $Ga(OH)_3$ may be formed around the core parts 44.

$$Ga^{3+}+3H_2O\rightarrow Ga(OH)_3+3H^+ \quad (2)$$

A material of the core parts 44 is not limited to carbon and may include at least one of polystyrene and $SiO_2$ as occasion demands. The material of the shell parts 45 is not limited to $Ga(OH)CO_3$ and $Ga(OH)_3$ and may include at least one of $Zn(OH)_3$, $Si(OH)_3$, and $Al(OH)_3$ as occasion demands.

A solvent of the solution 60 including the core-shell structures 43 may include at least one of acetone, ethanol, and water. In order to smoothly disperse the core-shell structures 43, ethanol and water may be mixed to be used as the solvent. In FIG. 3, A denotes an evaporated solvent and B denotes moisture of the evaporated solvent.

Density may be controlled by controlling capillary force C that operates between an evaporation speed of the solvent and a solute. In order to increase a degree of dispersion, the number of times of spin coating may be 1 to 5 and spin speed may be about 200 to 3,000 rpm. Density and a stack structure of the core-shell structure may be controlled by controlling the spin speed and the number of spin times.

As described above, the core-shell structures 43 dispersed on the substrate 1 may be obtained as illustrated in FIGS. 4A and 5A by applying the solution 60 including the core-shell structures 43 on the substrate 1 and then, evaporating the solvent. The core-shell structures 43 dispersed on the substrate 1 may vary with a ratio of the solvent used for hydrothermal synthesis, maintenance time, and ph control. Intervals among the core-shell structures 43 may vary with the ratio of the dispersion solvent. In addition, the core-shell structures 43 may be dispersed on one layer or may be dispersed on a number of layers unlike in the drawings. On the other hand, in FIG. 4A, the intervals among the plurality of core-shell structures 43 are uniform. However, the intervals among the plurality of core-shell structures 43 may be irregular as illustrated in FIG. 5A.

Next, the core parts 44 are removed from the core-shell structures 43 dispersed on the substrate 1. Therefore, only the shell parts 45 may be left on the substrate 1.

In order to remove the core parts 44, various methods may be used. For example, calcination of performing thermal processing at a predetermined temperature may be used. The core parts 44 are removed from the core-shell structures 43. The shell parts 45 maintain shapes although the core parts 44 are removed. A calcination temperature may be controlled so that the shapes of the shell parts 45 may be maintained. For example, the core-shell structures 43 may be calcined at a temperature between about 200° C. and about 700° C. During the calcination, the material of the shell parts 45 may be changed from $Ga(OH)_3$ into $\beta$-$Ga_2O_3$.

Next, the shell parts 45 are nitrified so that the hollow structures 40 including the hollows 41 and the external walls 42 including the nitride and surrounding the hollows 41 may be formed on the substrate 1 as illustrated in FIGS. 4C and 5C. The shell parts 45 may be nitrified at a temperature between about 800° C. and about 1,000° C. in $NH_3$ atmosphere and an inert atmosphere, for example, in an argon (Ar) atmosphere for about 1 to 5 hours. The shell parts 45 including β-$Ga_2O_3$ may be changed into the hollow structures 40 including GaN by the nitrification.

In the above-described embodiment, the nitrification is performed after the calcination. However, the inventive concept is not limited so that the nitrification and the calcination are separately performed. For example, the nitrification and the calcination may be simultaneously performed. For example, when the shell parts 45 including $Ga(OH)CO_3$ are calcined and nitrified, the shell parts 45 are not changed into β-$Ga_2O_3$ and may be directly changed into the hollow structures 40 including GaN.

Next, in a state where the hollow structures 40 are formed on the substrate 1 as illustrated in FIG. 4C, the buffer layer 30 may be formed on the substrate 1 and the hollow structures 40. Therefore, as illustrated in FIG. 1, the dislocation control layer 10 in which the hollow structures 40 are arranged under the buffer layer 30 may be formed.

Figure 6A:
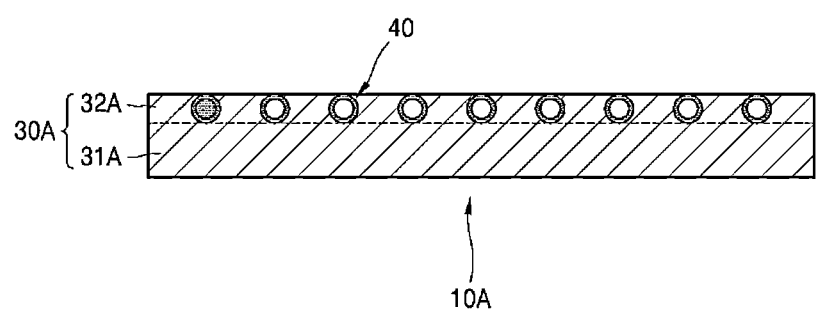
FIGS. 6A and 6B are cross-sectional views illustrating modifications of the dislocation control layer of FIG. 1.
Figure 6B:
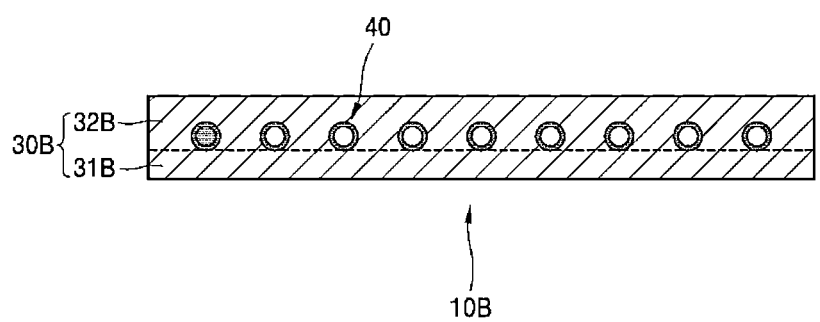

However, the hollow structures 40 are not arranged only under the buffer layer 30 of the dislocation control layer 10 but may be also arranged on a buffer layer 30A of a dislocation control layer 10A as illustrated in FIG. 6A and may be arranged in the middle of a buffer layer 30B of a dislocation control layer 10B as illustrated in FIG. 6B.

In order to arrange the hollow structures 40 as illustrated in FIG. 6A, after a first buffer layer 31A is formed on the substrate 1 and the hollow structures 40 are formed on the first buffer layer 31A, a second buffer layer 32A may be formed on the hollow structures 40 and the first buffer layer 31A.

In order to arrange the hollow structures 40 as illustrated in FIG. 6B, first and second buffer layers 31B and 32B and the hollow structures 40 are formed through a similar process as that of FIG. 6A so that a thickness of the first buffer layer 31B is reduced and a thickness of the second buffer layer 32B is increased in comparison with FIG. 6A.

The nitride semiconductor layer 20 may be formed on the dislocation control layers 10, 10A, and 10B according to the above-described embodiment. The nitride semiconductor layer 20 may be epitaxially grown. The nitride semiconductor layer 20 based on the nitride may include GaN. For example, the nitride semiconductor layer 20 may be $In_xAl_yGa_{1-x-y}N$ ($0 \le x$, $0 \le y$, $x+y \le 1$).

Figure 7:
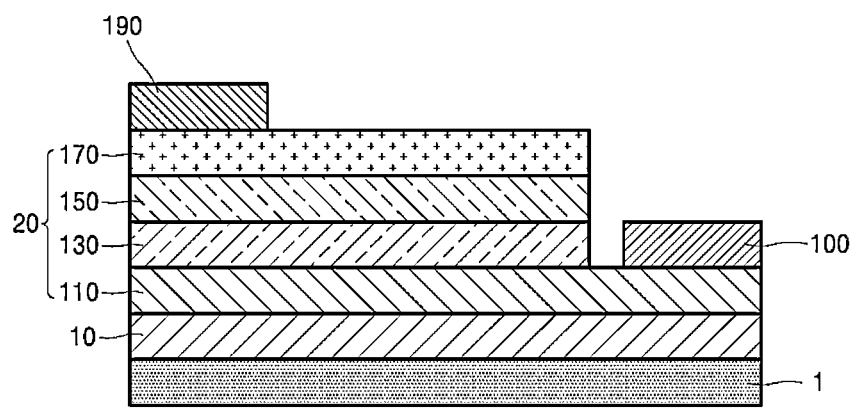
FIGS. 7 and 8 illustrate embodiments of nitride semiconductor light emitting elements as specific application examples of a nitride semiconductor device according to an embodiment of the inventive concept.
Figure 8:
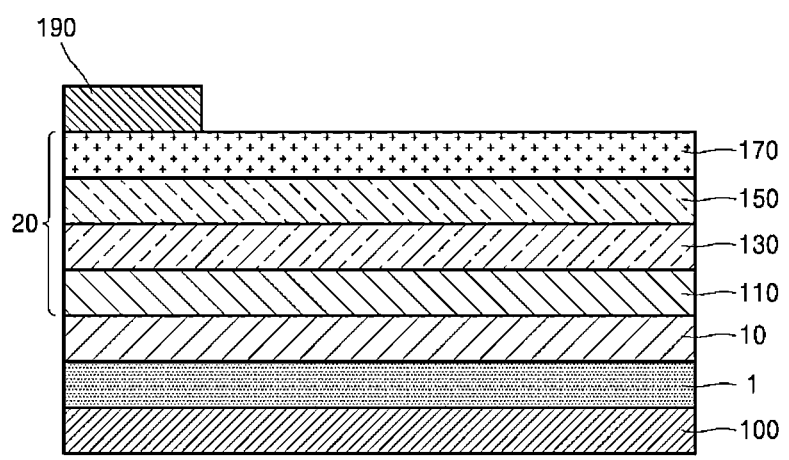

The nitride semiconductor layer 20 may have a single layer structure or a multilayer structure for manufacturing an electronic element or a light emitting element. FIGS. 7 and 8 illustrate embodiments of nitride semiconductor light emitting elements as specific application examples of a nitride semiconductor device according to an embodiment of the inventive concept. FIG. 7 illustrates a horizontal nitride semiconductor light emitting element and FIG. 8 illustrates a vertical nitride semiconductor light emitting element.

Referring to FIGS. 7 and 8, a nitride semiconductor light emitting element includes the substrate 1, the dislocation control layer 10 formed on the substrate 1, and the nitride semiconductor layer 20 formed on the dislocation control layer 10. The nitride semiconductor layer 20 may include a first conductive gallium nitride layer 110, an activation layer 130, and second conductive gallium nitride layers 150 and 170.

The nitride semiconductor light emitting element further includes first and second electrodes 100 and 190 for applying current so that light is generated by the activation layer 130. In the case of the horizontal nitride semiconductor light emitting element, as illustrated in FIG. 7, a part of the nitride semiconductor layer 20, for example, the first conductive gallium nitride layer 110 may be formed to be exposed and the first electrode 100 and the second electrode 190 may be formed on the exposed surface of the first conductive gallium nitride layer 110 and the second conductive gallium nitride layer 170. In the case of the vertical nitride semiconductor light emitting element, as illustrated in FIG. 9, the first electrode 100 may be formed on a rear surface of the substrate 1 and the second electrode 190 may be formed on the second conductive gallium nitride layer 170.

The first conductive gallium nitride layer 110 may be formed on the dislocation control layer 10. The first conductive gallium nitride layer 110 may be a gallium nitride layer doped with first conductive impurities. The first conductive impurities may be n-type impurities including silicon (Si), germanium (Ge), serenide (Se), and tellurium (Te). The first conductive gallium nitride layer 110 may be formed of a single layer or a plurality of layers grown while sequentially increasing or reducing the first conductive impurities. For example, the first conductive gallium nitride layer 110 may be an n-GaN layer grown while grading a doping amount of Si in order to form p-n conjunction.

The activation layer 130 arranged between the first conductive gallium nitride layer 110 and the second conductive gallium nitride layer 150 emits light having predetermined energy by re-combination of electrons and holes. The activation layer 130 may be formed of a semiconductor material such as $In_{1-x}Ga_xN$ ($0<x<1$) so that band gap energy is controlled in accordance with an amount of indium (In). The activation layer 130 may be a multi-quantum well (MQW) layer in which a quantum wall layer and a quantum well layer are alternately stacked.

The second conductive gallium nitride layers 150 and 170 may be formed on the activation layer 130. The second conductive gallium nitride layers 150 and 170 may be gallium nitride layers doped with second conductive impurities. The second conductive impurities may be p-type impurities including manganese (Mg), zinc (Zn), and beryllium (Be). For example, the second conductive gallium nitride layers 150 and 170 may be a plurality of p-GaN layers formed by two steps for performing the p-n conjunction and reducing contact resistance. The second conductive gallium nitride layers 150 and 170 of the two steps for reducing the contact resistance may be grown into a plurality of layers while controlling concentration of Mg, for example, while sequentially reducing or increasing the concentration of Mg so as to have ohmic contact resistance and high hole concentration.

When the first conductive gallium nitride layer 110 is an n-type gallium nitride layer and the second conductive gallium nitride layers 150a and 170 are p-type gallium nitride layers, the first electrode 100 may be an n-type electrode and the second electrode 190 may be a p-type electrode. On the other hand, although not shown, a transparent electrode layer may be arranged between the second electrode 190 and the second conductive gallium nitride layer 170. By arranging the transparent electrode layer, light transmittance may be improved, current diffusion may be facilitated, and the ohmic contact resistance may be reduced.

The above-described first conductive gallium nitride layer 110, activation layer 130, and second conductive gallium nitride layers 150 and 170 may be sequentially formed on the substrate 1 where the dislocation control layer 10 is formed by using MOCVD, molecular beam epitaxy (MBE), and hydride vapor phase epitaxy (HVPE) methods.

In the above, the case in which the nitride semiconductor light emitting elements as examples of the nitride semiconductor device according to the embodiment of the inventive concept have the stack structures of FIGS. 7 and 8 is illustrated. However, the embodiment according to the inventive concept is not limited to the above. In the nitride semiconductor light emitting element according to the embodiment of the present invention, the dislocation control layer 10 is formed on the substrate 1, the nitride semiconductor layer 20 is formed on the dislocation control layer 10, and the stack structure and material of the nitride semiconductor layer 20 may vary.

While the inventive concept has been particularly shown and described with reference to exemplary embodiments thereof, it will be understood that various changes in form and details may be made therein without departing from the spirit and scope of the following claims.

What is claimed is:

1. A method of manufacturing a nitride semiconductor device, the method comprising:
   applying a solution including a plurality of core-shell structures on a substrate;
   evaporating a solvent from the solution including the plurality of core-shell structures to disperse the plurality of core-shell structures on the substrate;
   removing core parts from the dispersed plurality of core-shell structures and nitrifying shell parts to form a plurality of hollow structures including a nitride; and
   forming a nitride semiconductor layer on the plurality of hollow structures.

2. The method of claim 1, wherein, including processing the substrate such that at least a part of a surface thereof is hydrophilic.

3. The method of claim 1, wherein the core parts of the core-shell structures are carbon nanospheres formed by a hydrothermal method.

4. The method of claim 1, wherein the core-shell structures are calcined to remove the core parts from the core-shell structures.

5. The method of claim 4, wherein the calcination of the core-shell structures is performed at a temperature between about 200° C. and about 700° C.

6. The method of claim 4, wherein the calcination of the core-shell structures and the nitrification of the shell parts are separately performed.

7. The method of claim 4, wherein the calcination of the core-shell structures and the nitrification of the shell parts are simultaneously performed.

8. The method of claim 6, wherein the shell parts of the core-shell structures comprise at least one of $Ga(OH)_3$ and $Ga(OH)CO_3$.

9. The method of claim 1, wherein a diameter of the core part of the core-shell structure is about 80 nm to about 10 um.

10. The method of claim 1, further comprising forming a buffer layer on the substrate after forming of the plurality of hollow structures.

11. The method of claim 1, further comprising forming a buffer layer on the substrate before forming of the plurality of hollow structures.

12. The method of claim 10, wherein the buffer layer comprises at least one of zinc oxide (ZnO), boron nitride (BN), aluminium nitride (AlN), gallium nitride (GaN), and $Al_{1-x}Ga_xN$ ($0<x<1$).

13. The method of claim 11, wherein the buffer layer comprises at least one of zinc oxide (ZnO), boron nitride (BN), aluminium nitride (AlN), gallium nitride (GaN), and $Al_{1-x}Ga_xN$ ($0<x<1$).

14. The method of claim 1, wherein the substrate is at least one of a sapphire substrate, a silicon substrate, and a silicon carbide (SiC) substrate.

15. The method of claim 1, wherein, in forming of the nitride semiconductor layer, an n-type gallium nitride layer, an activation layer, and a p-type gallium nitride layer are sequentially stacked on the substrate.

16. The method of claim 7, wherein the shell parts of the core-shell structures comprise at least one of $Ga(OH)_3$ and $Ga(OH)CO_3$.

* * * * *